(12) United States Patent
Kawabe

(10) Patent No.: US 7,908,100 B2
(45) Date of Patent: Mar. 15, 2011

(54) POWER CONSUMPTION ANALYZING APPARATUS AND POWER CONSUMPTION ANALYZING METHOD

(75) Inventor: Naoyuki Kawabe, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 264 days.

(21) Appl. No.: 12/142,073

(22) Filed: Jun. 19, 2008

(65) Prior Publication Data

US 2009/0006012 A1    Jan. 1, 2009

(30) Foreign Application Priority Data

Jun. 20, 2007    (JP) .................................. 2007-162510

(51) Int. Cl.
*G01R 31/00* (2006.01)
(52) U.S. Cl. ............... 702/60; 716/12; 714/22; 713/300; 713/320; 702/81; 702/182; 702/189; 326/38; 326/40; 326/41; 324/73.1
(58) Field of Classification Search .............. 716/12; 714/22; 713/300, 320; 702/60, 81, 182, 702/189; 326/38, 40, 41; 324/73.1
See application file for complete search history.

(56) References Cited

U.S. PATENT DOCUMENTS
6,552,572 B1 * 4/2003 Cheung et al. .................. 326/93

FOREIGN PATENT DOCUMENTS
JP    2006-190149    7/2006
JP    2008-134824 A    6/2008

OTHER PUBLICATIONS

Donno et al., 'Clock-Tree Power Optimization based on RTL Clock-Gating', 2003, DAC Publicaiton, pp. 622-627.*
Japanese Office Action mailed Nov. 5, 2010 for Japanese Patent Application No. 2007-162510.

* cited by examiner

*Primary Examiner* — Mohamed Charioui
*Assistant Examiner* — Elias Desta
(74) *Attorney, Agent, or Firm* — Turocy & Watson, LLP

(57) ABSTRACT

A power consumption analyzing apparatus has a clock gating cell detector configured to detect a clock gating cell which is not present in RTL data but present in a gate-level netlist, a test bench description generation unit configured to add a description concerning the clock gating cell, a monitor signal generation unit configured to specify a monitor signal used for power consumption analysis from the RTL data, an RTL simulation unit configured to execute operational simulation of the target circuit, a monitor unit configured to detect a logic of the monitor signal during the execution of the operational simulation, and a power consumption analysis unit configured to analyze power consumption.

20 Claims, 4 Drawing Sheets

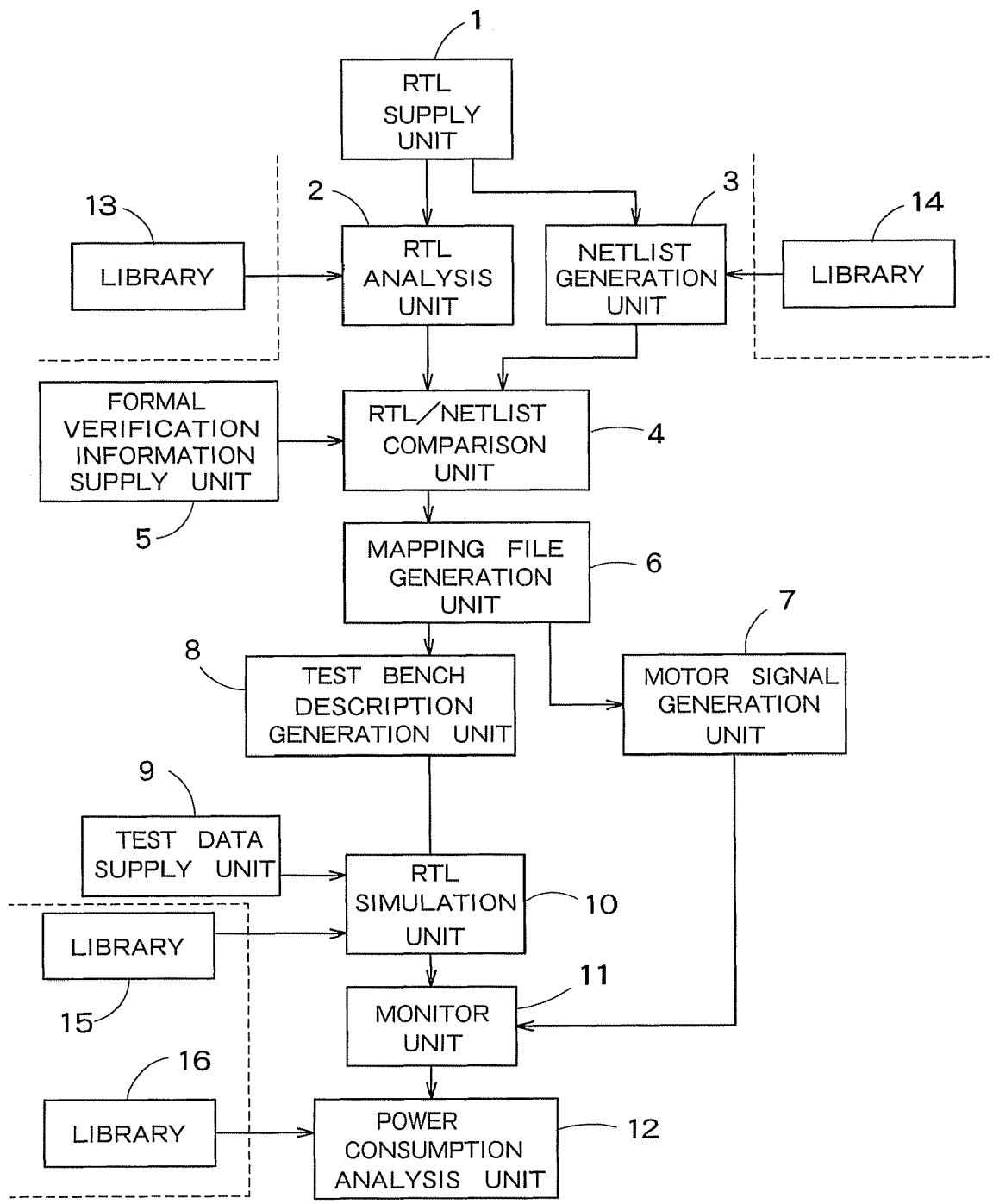
F I G. 1

```
module MOD1  (R1, DAT, CLK, en1, en2)  ;
    output  R1  ;
    input  DAT, CLK, en1, en2  ;
    reg  R1  ;
    always  @ (posedge  CLK)   begin
        if  (en1  &  en2)   begin
            R1  <=  DAT  ;
        end
    end
end  module
```
FIG. 3
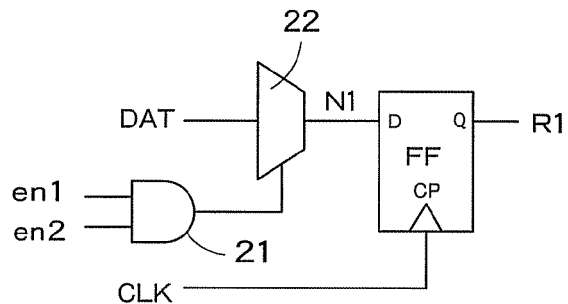
FIG. 4
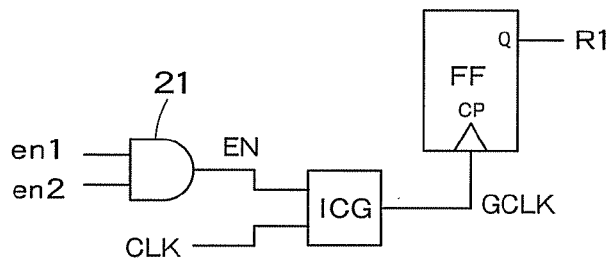
FIG. 5

```
module Testbench ;
    reg D, CLK, E1, E2 ;
    wire O ;
    MOD1 INST1 (.R1(O), .DAT(D), .CLK(CLK), .en1(E1), .en2(E2))
    reg GCLK ;
    wire EN, IQ ;
    assign EN = INST1.en1 & INST1.en2 ;
    assign GCLK = IQ & INST1.CLK ;
    always @ (INST1. CLK) begin
        if (~INST1.CLK) begin
            IQ <= #D1 EN ;
        end
    end
end module
```

MOD1.GCLK    Testbench.GCLK

MOD1.EN      Testbench.EN

POWER CONSUMPTION ANALYZING APPARATUS AND POWER CONSUMPTION ANALYZING METHOD

CROSS REFERENCE TO RELATED APPLICATIONS

This application is based upon claims the benefit of priority from the prior Japanese Patent Application No. 2007-162510, filed on Jun. 20, 2007, the entire contents of which are incorporated herein by reference.

BACKGROUND OF THE INVENTION

1. Field of the Invention

The present invention relates to a power consumption analyzing apparatus and a power consumption analyzing method that analyze a power consumption of a semiconductor integrated circuit on a design stage.

2. Related Art

When designing a digital circuit composed of a flip-flop and a combinational logic circuit, it is general to use an RTL (Register Transfer Level) to describe the circuit. The circuit described by the RTL is converted into a gate-level netlist including connection information of the circuits by using logic synthesis. The netlist is laid out on a semiconductor substrate.

The netlist generated by the logic synthesis of the RTL description is not necessarily one type, and a plurality of types of net lists can be generated from the same RTL description. Although the netlist includes various kinds of circuits such as a flip-flop or a clock gating cell, a power consumption of the flip-flop is considerably larger than those of other cells, and hence the power consumption of the flip-flop must be accurately estimated.

The power consumption of the flip-flop is calculated from toggle rates and duty ratios of a data input signal, a clock signal, and a data output signal. Among others, toggle rates of the clock signal and the data output signal have a great influence on the power consumption. Therefore, to accurately estimate the power consumption of the flip-flop, the toggle rates of the clock signal and the data output signal must be accurately obtained.

The flip-flop (a register) included in RTL data written by using the RTL description is also present in the netlist. The toggle rate and the duty ratio of the data output signal of the flip-flop included in both of the RTL data and net list can obtain the same results, even if an operational simulation is executed based on either of the RTL data or the netlist.

On the other hand, the power consumption varies depending on whether the clock signal from the flip-flop has passed through the clock gating cell before being input to the flip-flop. Even if the clock gating cell is present in the netlist, there is a possibility that it is not present in the RTL data. In such a case, an operation of the clock gating cell cannot be verified even if the RTL is used to perform the operational simulation.

Under the circumstances, there is a problem that the power consumption of the clock-gated flip-flop cannot be accurately estimated even though an RTL simulation is performed. This problem may possibly occur in not only the flip-flop but also in all cells to which the clock signal is input.

There has been proposed a technology of analyzing a power consumption based on a result of executing an operational simulation using RTL data obtained by associating the RTL data with a gate-level netlist (see Japanese Patent Application Laid-open Publication No. 2006-190149).

However, in the above publication, the operational simulation is executed while ignoring a clock gating cell that is not present in RTL data but present in a gate-level netlist. Therefore, according to the technique of the above publication, it is difficult to accurately analyze power consumption.

SUMMARY OF THE INVENTION

According to one aspect of the present invention, a power consumption analyzing apparatus comprising:

a clock gating cell detector configured to detect a clock gating cell which is not present in RTL data but present in a gate-level netlist based on the RTL data of a target circuit and the netlist corresponding to the RTL data;

a test bench description generation unit configured to add a description concerning the clock gating cell detected by the clock gating cell detector to the RTL data;

a monitor signal generation unit configured to specify a monitor signal used for power consumption analysis from the RTL data obtained by adding the description concerning the clock gating cell;

an RTL simulation unit configured to execute operational simulation of the target circuit by using the RTL data obtained by adding the description concerning the clock gating cell;

a monitor unit configured to detect a logic of the monitor signal during the execution of the operational simulation; and a power consumption analysis unit configured to analyze power consumption due to a toggle at a clock terminal of the clock synchronizing cell included in the target circuit.

According to one aspect of the present invention, a power consumption analyzing method comprising:

detecting a clock gating cell which is not present in RTL data but present in a gate-level netlist based on the RTL data of a target circuit and the netlist corresponding to the RTL data;

adding a description concerning the detected clock gating cell to the RTL data;

specifying a monitor signal used for power consumption analysis from the RTL data obtained by adding the description concerning the clock gating cell;

executing operational simulation of the target circuit by using the RTL data obtained by adding the description concerning the clock gating cell;

detecting a logic of the monitor signal during the execution of the operational simulation; and analyzing power consumption due to a toggle at a clock terminal of the clock synchronizing cell included in the target circuit.

BRIEF DESCRIPTION OF THE DRAWINGS

FIG. 1 is a block diagram showing an outline structure of a power consumption analyzing apparatus according to an embodiment of the present invention;

FIG. 3 is a view showing an example of RTL data;

FIG. 4 is a circuit diagram showing an example of a circuit generated by using the RTL data depicted in FIG. 3;

FIG. 5 is a circuit diagram showing an example of another circuit generated by using the RTL data depicted in FIG. 3;

DETAILED DESCRIPTION OF THE INVENTION

Figure 2:
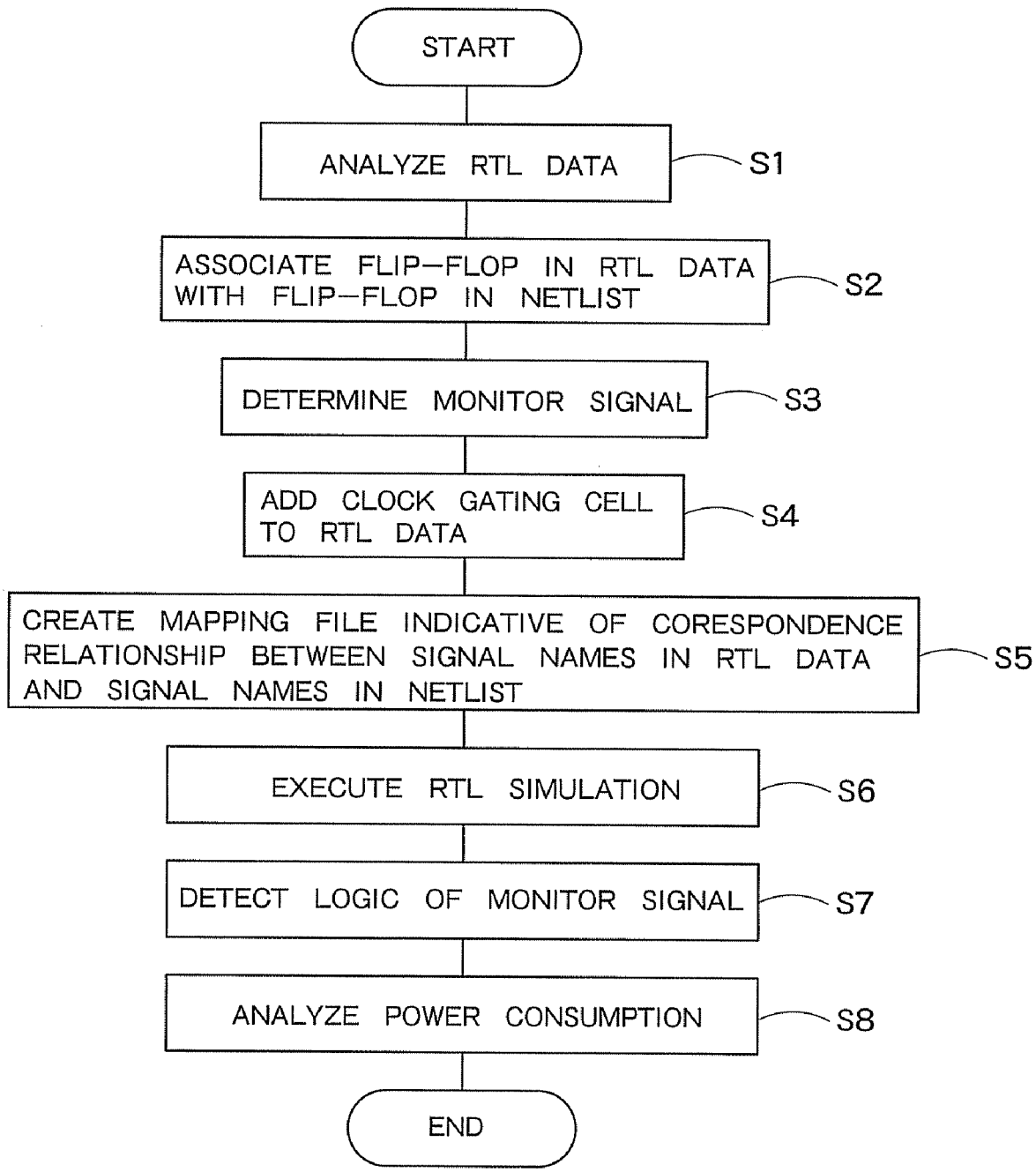
FIG. 2 is a flowchart showing an example of a processing operation of the power consumption analyzing apparatus according to the embodiment.

An embodiment according to the present invention will now be explained hereinafter with reference to the drawings.

FIG. 1 is a block diagram showing an outline configuration of a power consumption analyzing apparatus according to an embodiment of the present invention. The power consumption analyzing apparatus depicted in FIG. 1 includes an RTL supply unit 1, an RTL analysis unit 2, a gate-level netlist generation unit 3, an RTL/net list comparison unit (clock gating cell detector) 4, a formal verification information supply unit 5, a mapping file generation unit 6, a monitor signal generation unit 7, a test bench description generation unit 8, a test data supply unit 9, an RTL simulation unit 10, a monitor unit 11, and a power consumption analysis unit 12.

Libraries 13 to 16 are connected with the power consumption analyzing apparatus depicted in FIG. 1. These libraries 13 to 16 may be integrated as one or more unit, or they may be incorporated in the power consumption analyzing apparatus.

The RTL supply unit 1 supplies RTL data written by an operator to the RTL analysis unit 2, the netlist generation unit 3, and the RTL/net list comparison unit 4. The RTL analysis unit 2 makes reference to the library 13 to detect clock synchronizing cells such as a flip-flop or a clock buffer included in the RTL data and clock gating cells on a clock transmission paths for these clock synchronizing cells.

The netlist generation unit 3 makes reference to the library 14 to generate a gate-level netlist based on the RTL data. The RTL/net list comparison unit 4 makes reference to formal verification information of the RTL data supplied from the formal verification information supply unit 5 to compare the RTL data with the netlist, acquires correspondence information of respective nodes included in the RTL data and the netlist, and specifies a signal that should be monitored (which will be referred to as a monitor signal hereinafter). Based on the correspondence information, the RTL/net list comparison unit 4 detects the clock gating cell which is not present in the RTL data but present in the netlist. The monitor signal generation unit 7 determines a monitor signal to be monitored in the RTL data based on a result compared by the RTL/net list comparison unit 4. The monitor signal is set to a node that greatly affects a power consumption. More specifically, a clock signal that is input to each clock synchronizing cell such as a flip-flop or a clock buffer, or an input/output signal of each clock gating cell that is inserted in the clock transmission path is set as the monitor signal.

The test bench description generation unit 8 adds a description concerning the clock gating cell detected by the RTL/net list comparison unit 4 to the RTL data.

The test data supply unit 9 supplies test data used to analyze a power consumption. The RTL simulation unit 10 makes reference to the library 15 to supply the test data as input data, and executes an operational simulation based on the RTL data. The monitor unit 11 detects a logic of the monitor signal during execution of the simulation by the RTL simulation unit 10.

The power consumption analysis unit 12 makes reference to a detection result from the monitor unit 11 and the library 16 to analyze power consumptions of the flip-flop, the clock buffer, the clock gating cell, and others.

FIG. 2 is a flowchart showing an example of a processing operation of the power consumption analyzing apparatus according to this embodiment. The processing operation of the power consumption analyzing apparatus will now be explained hereinafter based on this flowchart.

First, the RTL analysis unit 2 analyzes RTL data of a target circuit based on the RTL data supplied from the RTL supply unit 1 (a step S1).

FIG. 3 is a view showing an example of the RTL data. In FIG. 3, a circuit module MOD1 is defined (a first line in FIG. 3). This circuit module has four input signals DAT, CLK, en1 and en2, and one output signal R1 (second and third lines). In a fourth line in FIG. 3, a register R1 is defined, and an operation of the register R1 is written in fifth and subsequent lines.

The fifth line shows that the operation is performed at a rising edge of the clock signal CLK. A sixth line shows that the data input signal DAT is latched to output the data output signal R1 when both the enable signals en1 and en2 are enabled.

At the step S1, the RTL analysis unit 2 detects each clock synchronizing cell such as a flip-flop or a clock buffer (which will be generically referred to as a flip-flop hereinafter) and also detects a clock transmission path for the clock signal that is input to the clock synchronizing cell.

Then, the RTL/net list comparison unit 4 compares the RTL data with a gate-level netlist generated based on this RTL data by the netlist generation unit 3, and associates the flip-flop in the RTL data with the clock synchronizing cell in the netlist (a step S2).

Subsequently, the monitor signal generation unit 7 determines a monitor signal that should be monitored in the RTL data based on a comparison result obtained by the RTL/net list comparison unit 4 (a step S3). Here, a clock terminal of the clock synchronizing cell such as a flip-flop or a clock buffer or a node on the clock transmission path connected with the clock terminal is determined as the monitor signal.

Then, the test bench description generation unit 8 adds a description concerning a clock gating cell that is present in the netlist but not present in the RTL data (which will be referred to as a test bench description hereinafter) to the RTL data (a step S4).

FIGS. 4 and 5 are circuit diagrams each showing an example of a circuit generated by using the RTL data depicted in FIG. 3. As can be understood from FIGS. 4 and 5, even if the same RTL data is used, the number of a circuit expression method is not necessarily one. Therefore, the netlist generated by the netlist generation unit 3 based on the RTL data depicted in FIG. 3 may become like a circuit depicted in FIG. 4 or may become like a circuit shown in FIG. 5, or it may possibly become any other circuit.

The circuit depicted in FIG. 4 has an AND gate 21 that calculates a logical product of the enable signals en1 and en2, a buffer 22 that changes over whether the input data DAT should be transmitted therethrough based on a logic of the AND gate 21, and a flip-flop FF that fetches an output signal from the buffer in synchronization with the clock CLK.

On the other hand, the circuit shown in FIG. 5 has the same AND gate 21 as that in FIG. 4, a clock gating cell ICG that latches an output signal from the AND gate 21 in synchronization with the clock CLK, and a flip-flop FF that changes over a logic in synchronization with an output signal from the clock gating cell ICG. The clock gating cell ICG in FIG. 5 is a clock gating cell automatically generated by the netlist generation unit 3.

Figures 6, 7, 8:
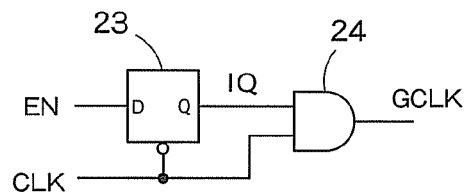
FIG. 6 is a circuit diagram showing an example of an internal structure of a clock gating cell ICG.
FIG. 7 is a view showing an example of a test bench description.
FIG. 8 is a view showing an example of a mapping file.

FIG. 6 is a circuit diagram showing an example of an internal structure of the clock gating cell ICG. The clock gating cell ICG in FIG. 6 has a latch 23 and an AND gate 24. The latch 23 latches an enable signal EN when the clock CLK has a logic 1, and allows the enable signal to be transmitted therethrough when the clock CLK has a logic 0. The AND gate 24 calculates a logical product of the clock CLK and an output from the latch 23. As a result, the AND gate 24 allows the clock CLK to be transmitted therethrough only when the enable signal EN has the logic 1.

It is to be noted that the circuit depicted in FIG. 6 is just an example, and the clock gating cell ICG may be formed of a circuit other than that depicted in FIG. 6.

It is assumed that a gate-level netlist of the circuit shown in FIG. 5 is generated by using the RTL data depicted in FIG. 3, for example. Since the RTL data in FIG. 3 does not have a description concerning the clock gating cell ICG in the circuit depicted in FIG. 5, even if the RTL data in FIG. 3 alone is used to execute an RTL simulation, a power consumption of the clock gating cell ICG itself or an output signal from the clock gating cell ICG, i.e., a toggle rate or a duty ratio of a clock signal of the FF cannot be analyzed.

Thus, at the step S4, the test bench description generation unit 8 adds a description of the clock gating cell ICG to the RTL data. This is called a test bench description. It is possible to set an input or output signal of the clock gating cell added by the step S4 as the monitor signal.

FIG. 7 is a view showing an example of the test bench description. In a first line in FIG. 7, a circuit module Testbench is defined. In a fourth line, the circuit module MOD1 in FIG. 3 is called to be instantized. A correspondence relationship between an input/output signal in the RTL data and an input/output signal of the circuit depicted in FIG. 5 is represented in parentheses following INST1 in the fourth line.

Further, a part following "always" in a ninth line in FIG. 7 is a description of the clock gating cell ICG that is the clock gating cell depicted in FIG. 5.

Based on such a test bench description as shown in FIG. 7, the clock gating cell that is not present in the original RTL data can be added to the RTL data.

Then, the mapping file generation unit 6 generates a mapping file indicative of a correspondence relationship between signal names in the RTL data and signal names in the netlist (a step S5). FIG. 8 is a view showing an example of the mapping file. In FIG. 8, a correspondence relationship of input signals that should be monitored (clocks GCLK and enable signals EN).

Subsequently, the RTL simulation unit 10 executes an RTL simulation based on the test bench description in FIG. 7 (a step S6). At the time of the RTL simulation, test data supplied from the test data supply unit 9 is determined as an input signal to execute the RTL simulation. As a result, an operational simulation can be executed in a state where the description concerning the clock gating cell is added to the RTL data.

The monitor unit 11 detects a logic of the monitor signal determined at the step S3 during execution of the RTL simulation (a step S7). The clock synchronizing cell such as a flip-flop or a clock buffer exerts a large influence on a power consumption of the circuit. Thus, an input/output signal of the clock synchronizing cell is determined as a monitor signal to detect its logic.

Then, the power consumption analysis unit 12 detects not only a toggle rate or a duty ratio of the clock terminal such as a flip-flop or a clock buffer but also a toggle rate or a duty ratio of an input/output signal of the clock gating cell added in the test bench description based on a result detected at the step S7, and analyzes power consumptions of various clock synchronizing cells such as a flip-flop or a clock buffer (a step S8).

As explained above, according to this embodiment, the RTL data is compared with the netlist, the description concerning the clock gating cell that is not present in the RTL data but present in the netlist is added to the RTL data, the RTL simulation is executed based on the RTL data after addition, and toggle rates or duty ratios of input/output signals of the various clock gating cells are detected to analyze power consumptions of the various clock gating cells, thereby simply and accurately analyzing a power consumption of the circuit including the clock gating cells.

In particular, according to this embodiment, since the power consumption can be accurately analyzed without executing the simulation using the netlist that requires an enormous time for a simulation, a time required for analysis of the power consumption can be greatly reduced.

In the foregoing embodiment, the description has been given as to the example where the toggle rate or the duty ratio of the clock terminal of each clock synchronizing cell, e.g., the flip-flop, the clock buffer, or the clock gating cell is monitored to analyze the power consumption, but a toggle rate or a duty rate of an enable signal of the clock synchronizing cell may be monitored. Furthermore, It is unnecessary to detect both of the toggle rate and the duty ratio. Advantageous effect of the present embodiment can be obtained by either of the toggle rate or the duty ratio.

Moreover, a state probability or a transition probability of the clock terminal of each clock synchronizing cell may be monitored to analyze the power consumption.

What is claimed is:

1. A power consumption analyzing apparatus comprising:
a clock gating cell detector configured to detect a clock gating cell which is not present in RTL data indicative of Register Transfer Level data but present in a gate-level netlist based on the RTL data of a target circuit and the netlist corresponding to the RTL data;
a test bench description generation unit configured to add a description concerning the clock gating cell detected by the clock gating cell detector to the RTL data;
a monitor signal generation unit configured to specify a monitor signal used for power consumption analysis from the RTL data obtained by adding the description concerning the clock gating cell;
an RTL simulation unit configured to execute operational simulation of the target circuit by using the RTL data obtained by adding the description concerning the clock gating cell;
a monitor unit configured to detect a logic of the monitor signal during the execution of the operational simulation; and
a power consumption analysis unit configured to analyze power consumption due to a toggle at a clock terminal of a clock synchronizing cell included in the target circuit.

2. The power consumption analyzing apparatus according to claim 1, wherein the clock synchronizing cell for analyzing power consumption includes a flip-flop.

3. The power consumption analyzing apparatus according to claim 1, wherein the clock synchronizing cell for analyzing power consumption includes a clock buffer.

4. The power consumption analyzing apparatus according to claim 1, wherein the power consumption analysis unit analyzes power consumption due to the toggle at the clock terminal of the clock synchronizing cell based on a result of detecting at least one of a toggle rate and a duty ratio of the monitor signal.

5. The power consumption analyzing apparatus according to claim 1, wherein the power consumption analysis unit analyzes power consumption due to the toggle at the clock terminal of the clock synchronizing cell based on a result of detecting at least one of a state probability or a transition probability of the monitor signal.

6. The power consumption analyzing apparatus according to claim 1, further comprising a mapping file generation unit configured to generate a mapping file which records a correspondence relationship between signal names included in the description concerning the clock gating cell added in the RTL data and signal names in the netlist,
wherein the power consumption analysis unit makes reference to the mapping file to analyze power consumption due to the toggle at the clock terminal of the clock synchronizing cell arranged on a transmission path on which the clock gating cell is connected.

7. The power consumption analyzing apparatus according to claim 1, wherein the clock gating cell detector detects the clock gating cell which is connected on a transmission path of the clock signal input in or output from a flip-flop and a clock buffer included in the netlist and is not present in the RTL data; and the power consumption analysis unit analyzes power consumption due to the toggle at the clock terminals of the flip-flop and clock buffer.

8. The power consumption analyzing apparatus according to claim 1, wherein the monitor unit sets at least one of a clock signal and an enable signal of the clock synchronizing cell as the monitor signal.

9. The power consumption analyzing apparatus according to claim 1, wherein the monitor signal generation unit sets a signal exerting a large influence on power consumption as the monitor signal.

10. The power consumption analyzing apparatus according to claim 1, wherein the clock gating cell detector makes reference to formal verification information of the RTL data to detect the clock gating cell which is present in the RTL data but not present in the netlist based on a result of comparing the RTL data with the netlist.

11. A power consumption analyzing method comprising:

detecting a clock gating cell which is not present in RTL data indicative of Register Transfer Level data but present in a gate-level netlist based on the RTL data of a target circuit and the netlist corresponding to the RTL data;

adding a description concerning the detected clock gating cell to the RTL data;

specifying a monitor signal used for power consumption analysis from the RTL data obtained by adding the description concerning the clock gating cell;

executing operational simulation of the target circuit by using the RTL data obtained by adding the description concerning the clock gating cell;

detecting a logic of the monitor signal during the execution of the operational simulation; and analyzing power consumption due to a toggle at a clock terminal of a clock synchronizing cell included in the target circuit.

12. The power consumption analyzing method according to claim 11, wherein the clock synchronizing cell for analyzing power consumption includes a flip-flop.

13. The power consumption analyzing method according to claim 11, wherein the clock synchronizing cell for analyzing power consumption includes a clock buffer.

14. The power consumption analyzing method according to claim 11, wherein power consumption due to the toggle at the clock terminal of the clock synchronizing cell is analyzed based on a result of detecting at least one of a toggle rate and a duty ratio of the monitor signal.

15. The power consumption analyzing method according to claim 11, wherein power consumption due to the toggle at the clock terminal of the clock synchronizing cell is analyzed based on a result of detecting at least one of a state probability or a transition probability of the monitor signal.

16. The power consumption analyzing method according to claim 11, further comprising:

generating a mapping file which records a correspondence relationship between signal names included in the description concerning the clock gating cell added in the RTL data and signal names in the netlist, wherein mapping file is referred to analyze power consumption due to the toggle at the clock terminal of the clock synchronizing cell arranged on a transmission path on which the clock gating cell is connected.

17. The power consumption analyzing method according to claim 11, wherein the clock gating cell detector detects the clock gating cell which is connected on a transmission path of the clock signal input in or output from a flip-flop and a clock buffer included in the netlist and is not present in the RTL data; and power consumption due to the toggle at the clock terminals of the flip-flop and clock buffer is analyzed.

18. The power consumption analyzing method according to claim 11, wherein at least one of a clock signal and an enable signal of the clock synchronizing cell is set as the monitor signal.

19. The power consumption analyzing method according to claim 11, wherein a signal exerting a large influence on power consumption is set as the monitor signal.

20. The power consumption analyzing method according to claim 11, wherein formal verification information of the RTL data is referred to detect the clock gating cell which is present in the RTL data but not present in the netlist based on a result of comparing the RTL data with the netlist.

* * * * *